United States Patent
Veytsman

(10) Patent No.: US 12,451,898 B2
(45) Date of Patent: Oct. 21, 2025

(54) UTILIZING MULTIPLE ANALOG-TO-DIGITAL CONVERTERS IN A CONVERSION CIRCUIT

(71) Applicant: Microsoft Technology Licensing, LLC, Redmond, WA (US)

(72) Inventor: Genady Veytsman, Netanya (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 189 days.

(21) Appl. No.: 18/184,980

(22) Filed: Mar. 16, 2023

(65) Prior Publication Data

US 2024/0313797 A1   Sep. 19, 2024

(51) Int. Cl.
| | | |
|---|---|---|
| *H03M 1/38* | (2006.01) | |
| *H03M 1/06* | (2006.01) | |
| *H03M 1/16* | (2006.01) | |
| *H03M 1/46* | (2006.01) | |

(52) U.S. Cl.
CPC ........... *H03M 1/38* (2013.01); *H03M 1/0695* (2013.01); *H03M 1/0697* (2013.01); *H03M 1/164* (2013.01); *H03M 1/46* (2013.01)

(58) Field of Classification Search
CPC .... H03M 1/38; H03M 1/0695; H03M 1/0697; H03M 1/46; H03M 1/164
USPC .......................................................... 341/161
See application file for complete search history.

(56) References Cited

U.S. PATENT DOCUMENTS

| | | |
|---|---|---|
| 9,197,238 B1 | 11/2015 | Nagaraj et al. |
| 9,219,492 B1 * | 12/2015 | Lok .................. H03M 1/002 |
| 9,432,035 B2 * | 8/2016 | Vyas .................... H03M 1/1225 |
| 9,608,655 B1 | 3/2017 | Li et al. |
| 9,673,835 B1 * | 6/2017 | Kinyua ................ H03M 1/0607 |
| 9,806,734 B1 * | 10/2017 | Madan .................... H03M 1/46 |
| 10,103,742 B1 * | 10/2018 | Guo ........................ H03M 1/145 |
| 10,256,834 B1 * | 4/2019 | Kinyua ................. H03M 1/145 |
| 10,447,292 B1 | 10/2019 | Price |
| 10,541,704 B2 * | 1/2020 | Wu .......................... H03M 1/46 |
| 10,763,886 B1 | 9/2020 | Narayan et al. |

(Continued)

FOREIGN PATENT DOCUMENTS

EP   3550725 A1   10/2019

OTHER PUBLICATIONS

International Search Report and Written Opinion received for PCT Application No. PCT/US2024/018982, Jul. 2, 2024, 13 pages.

*Primary Examiner* — Khai M Nguyen
(74) *Attorney, Agent, or Firm* — Alleman Hall & Tuttle LLP

(57) ABSTRACT

Examples are disclosed related to analog to digital conversions. One example provides a conversion circuit comprising a first analog-to-digital converter (ADC) configured to convert an analog voltage to generate a first subset of digital output bits from a most significant bit (MSB) to a bit k and a second subset of digital output bits from a bit k−1 to a least significant bit (LSB) of the first ADC. The bit k is between the MSB and the LSB. The first ADC comprises a residual output configured to output a residual voltage of the analog voltage after converting the bit k. The conversion circuit further comprises an amplifier stage connected to the residual output and configured to generate an amplified residual voltage. The conversion circuit further comprises a second ADC connected to the amplifier stage and configured to convert the amplified residual voltage to generate extra digital output bits.

19 Claims, 7 Drawing Sheets

(56) References Cited

U.S. PATENT DOCUMENTS

| | | |
|---|---|---|
| 10,886,933 B1 * | 1/2021 | Ghosh .................. H03M 1/164 |
| 10,938,399 B1 | 3/2021 | Chao |
| 11,218,158 B1 * | 1/2022 | Patil .................. H03M 1/1071 |
| 2005/0285770 A1 | 12/2005 | Ye |
| 2010/0156692 A1 | 6/2010 | Jeon et al. |

* cited by examiner

UTILIZING MULTIPLE ANALOG-TO-DIGITAL CONVERTERS IN A CONVERSION CIRCUIT

BACKGROUND

Many sensors use analog-to-digital converters (ADC) to convert analog voltages to digital bits for later processing. In some applications of the sensors, a higher resolution ADC can be beneficial. However, higher resolution ADCs can be challenging to design. Further, higher resolution ADCs can consume a higher developmental cost over lower resolution ADCs. Further, many higher resolution ADCs may consume more power and/or area than lower resolution ADCs.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to a conversion circuit for converting an analog voltage to digital output bits. One example provides a conversion circuit comprising a first analog-to-digital converter (ADC) configured to convert an analog voltage to generate a first subset of digital output bits from a most significant bit (MSB) to a bit k and then generate a second subset of digital output bits from a bit k−1 to a least significant bit (LSB) of the first ADC. The bit k is between the MSB and the LSB of the first ADC. The first ADC comprises a residual output configured to output a residual voltage of the analog voltage after converting the bit k. The conversion circuit further comprises an amplifier stage connected to the residual output of the first ADC. The amplifier stage is configured to generate an amplified residual voltage at an output of the amplifier stage. The conversion circuit further comprises a second ADC connected to the output of the amplifier stage. The second ADC is configured to convert the amplified residual voltage at the output of the amplifier stage to generate extra digital output bits.

DETAILED DESCRIPTION

As previously mentioned, many sensors use ADCs to convert analog voltages to digital bits for later processing. Some ADCs convert the analog voltage from a most significant bit (MSB) to a least significant bit (LSB) of the ADC. The MSB is associated with a larger analog voltage difference in the ADC and the LSB is associated with a smaller analog voltage difference in the ADC. The smaller analog voltage difference may be closer to a noise floor of a comparator of the ADC. Therefore, the comparator may have a higher probability of error when evaluating the smaller analog voltage difference. One possible solution is to use sub-ranging techniques in the ADC. For example, such sub-range techniques serially first convert N-k bits, then multiply the residue, then convert the remaining k bits. This enables a larger analog voltage difference when evaluating the lesser significant bits. However, such sub-ranging techniques rely on accurate gain stages of an amplifier for evaluation of a next stage.

Accordingly, examples are disclosed that relate to a conversion circuit comprising a first ADC, an amplifier stage, and a second ADC. The first ADC is configured to convert an analog voltage to generate a first subset of digital output bits from a MSB to a bit k and then to generate a second subset of digital output bits from a bit k−1 to a LSB of the first ADC. The bit k is between the MSB and the LSB of the first ADC. The first ADC comprises a residual output configured to output a residual voltage of the analog voltage after converting the bit k. The amplifier stage is connected to the residual output of the first ADC. The amplifier stage is configured to generate an amplified residual voltage at an output of the amplifier stage. The second ADC is connected to the output of the amplifier stage. The second ADC is configured to convert the amplified residual voltage at the output of the amplifier stage to generate extra digital output bits. The extra digital output bits and the second subset of digital output bits comprise overlapping information relating to the residual voltage. Post-processing of the bits generated by the first ADC and the bits generated by the second ADC can help to extend a bit resolution for the conversion circuit over using just the first ADC. The use of a conversion circuit comprising two ADCs can help to increase an accuracy of the conversion circuit over using a higher resolution single ADC. Further, the conversion circuit may help to reduce area, electrical power, and/or developmental costs over a higher resolution single ADC. The disclosed conversation circuit may be particularly suitable for use in circuit designs where a design limiting factor is a noise constraint of a comparator as opposed to self-noise of preceding circuits.

Figure 1:
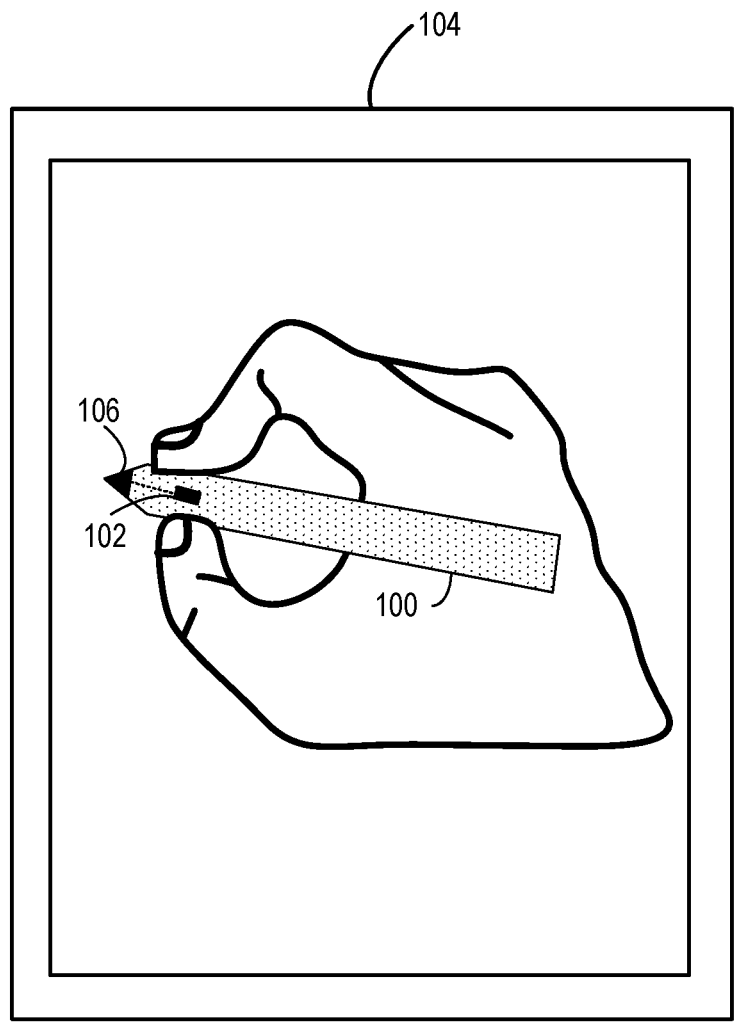
FIG. 1 schematically depicts an example device in the form of a digital pen utilizing a conversion circuit.

Before discussing the disclosed examples in detail, FIG. 1 depicts an example device 100 comprising a conversion circuit 102. Device 100 is in the form of a digital pen. Here, device 100 communicates with tablet 104. Device 100 comprises a pressure sensor 106 that senses a pressure at a tip of device 100. The pressure can indicate a writing pressure of device 100 against tablet 104, or another suitable pressure measurement. Conversion circuit 102 is connected to an output of pressure sensor 106. Conversion circuit 102 is configured to convert an analog voltage from the pressure sensor and generate digital output bits for later processing, as will be discussed in more detail below. The later processing may result in device 100 and/or tablet 104 performing a specified task based on the writing pressure of device 100. While depicted as a digital pen, device 100 can take other suitable forms, such as tablets, phones, laptops, microphones, and digital sensors, for example. FIG. 1 is illustrative. In other examples, conversion circuit 102 can sample another suitable analog voltage from any other suitable type of sensor, such as light sensors, acoustic sensors, thermal sensors, touch sensors, and chemical sensors, for example.

As previously mentioned, a higher resolution of a conversion circuit may be desired for certain applications. In the example of FIG. 1, a higher resolution of conversion circuit 102 can help detect a larger number of different writing pressure levels of device 100. However, developing a single higher resolution ADC can incur extra development time and/or costs.

Figure 2:
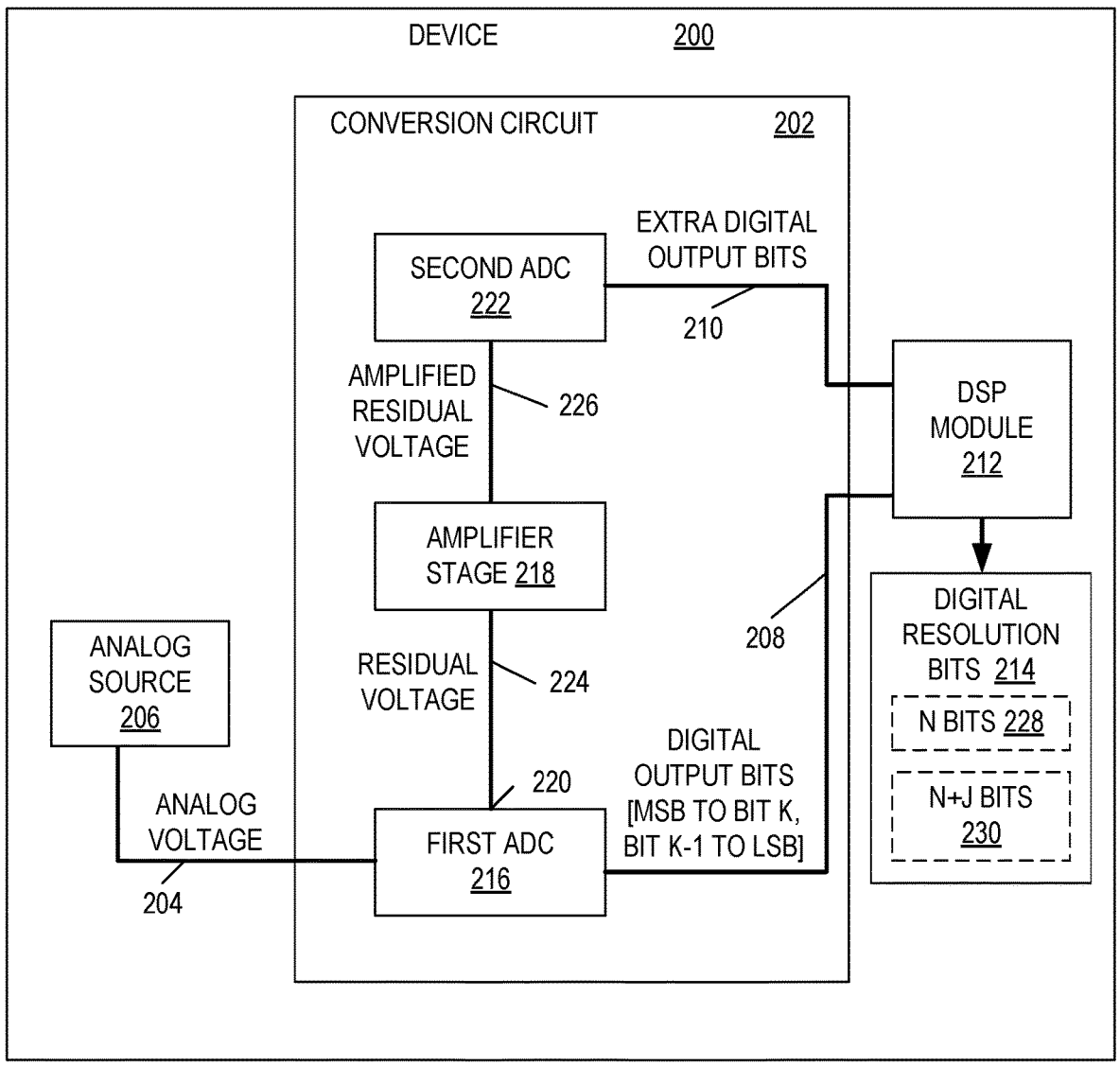
FIG. 2 shows a block diagram of an example device comprising a conversion circuit.

Accordingly, a conversion circuit utilizing two ADCs can extend a bit resolution over a single higher resolution ADC. Further, the conversion circuit utilizing the two ADCs can help to increase an accuracy of the conversion circuit. FIG. 2 depicts a block diagram of an example device 200 comprising a conversion circuit 202. Conversion circuit 102 is an example of conversion circuit 202. Device 200 can be any suitable device that utilizes converting analog voltages to digital bits for later processing. Example devices include, but are not limited to digital pens, tablets, phones, microphones, and digital sensors. Conversion circuit 202 is configured to sample an analog voltage 204 from an analog source 206 and generate digital output bits 208 and extra digital output bits 210 based on analog voltage 204. Analog source 206 can comprise an output of a sensor, a detected input of device 200, a received electromagnetic signal, or another suitable source of analog voltages. Device 200 further comprises a digital signal processing (DSP) module 212 for post-processing digital output bits 208 and extra digital output bits 210 to generate digital resolution bits 214. Here, a number of digital output bits 208 and extra digital output bits 210 is larger than a number of digital resolution bits 214. Therefore, DSP module 212 is configured to extract desired bits from digital output bits 208 and extra digital output bits 210 to generate digital resolution bits 214. As a specific example, DSP module 212 can use interpolation or another suitable signal processing algorithm to generate digital resolution bits 214. Further, DSP module 212 can use some form of error correction when receiving both digital output bits 208 and extra digital output bits 210, where digital output bits 208 and extra digital output bits 210 have overlap.

Conversion circuit 202 comprises a first ADC 216 connected to analog source 206, an amplifier stage 218 connected to a residual output 220 of first ADC 216, and a second ADC 222 connected to an output of amplifier stage 218. First ADC 216 is configured to convert analog voltage 204 to generate a first subset of digital output bits 208 from a MSB to a bit k and then generate a second subset of digital output bits 208 from a bit k−1 to a LSB of first ADC 216. The bit k is between the MSB and the LSB of first ADC 216. In some examples, the bit k can be configurable to different values, such as using firmware, for example. Residual output 220 is configured to output residual voltage 224 of analog voltage 204 after converting the bit k. First ADC 216 can comprise any suitable ADC configured to gradually convert an analog voltage, such as a successive-approximation (SAR) ADC and a pipeline ADC, for example. An example ADC circuit for use as first ADC 216 is discussed below with reference to FIG. 5.

Amplifier stage 218 is configured to amplify residual voltage 224 to generate an amplified residual voltage 226 at the output of amplifier stage 218. As a specific example, residual voltage 224 can be multiplied by a gain factor of amplifier stage 218 to generate amplified residual voltage 226. In some examples, the gain factor can be configurable, such as using firmware of device 200, for example. The higher the gain factor of amplifier stage 218, more overlap is generated between extra digital output bits 210 and digital output bits 208. The overlap can help DSP module 212 to generate digital resolution bits 214. It will be appreciated that a noise on residual voltage 224 is also amplified by amplifier stage 218. Therefore, amplifier stage 218 comprises a linear low-noise amplifier. Further, amplifier stage 218 can comprise an operational-amplifier or another suitable amplifier. In some examples, amplified residual voltage 226 is configured to be smaller than a full dynamic range of second ADC 222. In some such examples, one or more higher significant bits of second ADC 222 can be preloaded with logical zeros. In other examples, amplified residual voltage 226 can be configured to use the full dynamic range of second ADC 222.

Second ADC 222 is configured to convert amplified residual voltage 226 at the output of amplifier stage 218 to generate extra digital output bits 210. In some examples, second ADC 222 is configured to generate extra digital output bits 210 in parallel with first ADC 216 generating the second subset of digital output bits 208. Such a configuration can help to reduce a time to generate both the second subset of digital output bits 208 and extra digital output bits 210, and thus digital resolution bits 214. In some examples, second ADC 222 can comprise a same circuit template as first ADC 216 to help reduce development costs as discussed with reference to FIG. 3. More specifically, using the same circuit template for both first ADC 216 and second ADC 222 reduces the number of unique circuits that need to be designed and verified. In other examples, first ADC 216 and second ADC 222 can comprise different circuit templates as discussed with reference to FIG. 4. Using different circuit templates, may enable second ADC 222 to have different circuits than first ADC 216 which may consume less area and/or electrical power.

Digital resolution bits 214 can optionally comprise N bits 228 that indicate a value of analog voltage 204. As used herein, "N" indicates a number of bits from the MSB to the LSB of first ADC 216. Using conversion circuit 202 to help generate N bits 228 of digital resolution bits 214 can help to increase an accuracy of an analog-to-digital conversion over using only first ADC 216. Alternatively, digital resolution bits 214 can comprise N+j bits 230. As used herein, "j" is used to denote a number of bits to extend the resolution of first ADC 216. Generally, j is less than the number of extra digital output bits 210. In some examples, j can comprise one, two, or three bits. In such a manner, conversion circuit 202 can help to extend a bit resolution of an analog-to-digital conversion over using only first ADC 216, while also helping to reduce developmental costs.

Figure 3:
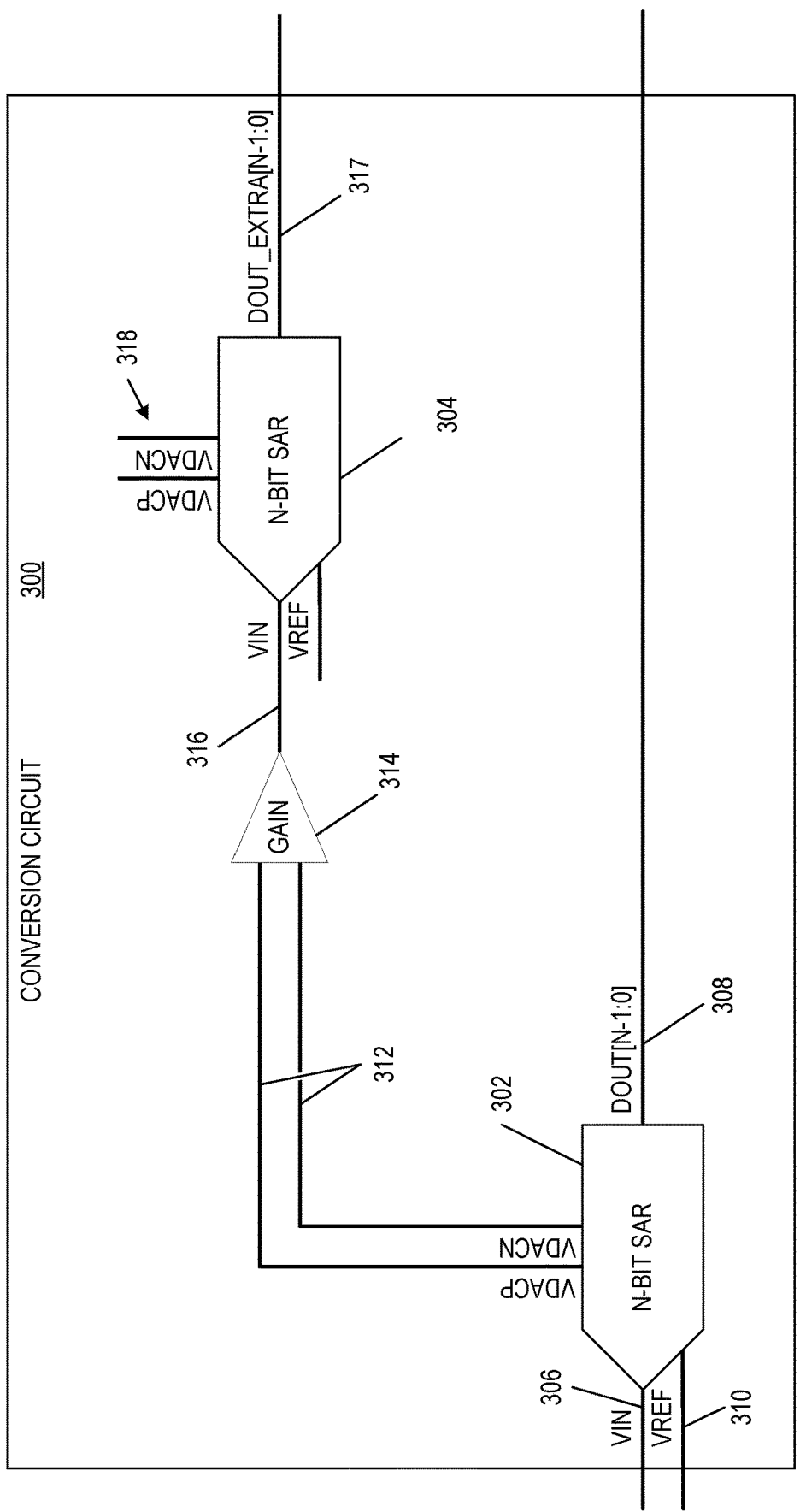
FIG. 3 schematically depicts an example conversion circuit using a same circuit template for a first ADC and a second ADC.

As previously mentioned, a same circuit template can be used to implement a first ADC and to implement a second ADC. FIG. 3 schematically depicts an example conversion circuit 300 utilizing a same circuit template to implement a first ADC 302 and a second ADC 304. Conversion circuit 300 is an example implementation of conversion circuit 202. As shown, first ADC 302 and second ADC 304 use a same N-bit SAR ADC circuit template. In other examples, first ADC 302 and second ADC 304 can use a same circuit template comprising another suitable gradually converging ADC circuit template, such as a pipeline ADC circuit template. The use of a gradually converging ADC facilitates providing the residual voltage of the first ADC to the second ADC at a known bit location.

First ADC 302 is configured to convert an analog voltage 306 (shown here as Vin) to digital output bits 308 using a reference voltage Vref 310. More particularly, first ADC 302 is configured to convert analog voltage 306 to generate a first subset of digital output bits 308 from the MSB to a bit k of first ADC 302 and generate a second subset of digital output bits 308 from a bit k−1 to a LSB of first ADC. The bit k is between the MSB and the LSB of first ADC 302. Here, the MSB is depicted as "N−1" and the LSB is depicted as "0." First ADC 302 comprises a residual output configured to output a residual voltage 312 of analog voltage 306 after converting the bit k. As shown, residual voltage 312 comprises "Vdacp" and "Vdacn." In other examples, residual voltage 312 can comprise another suitable voltage.

Conversion circuit 300 further comprises an amplifier stage 314 connected to the residual output of first ADC 302. Similar to amplifier stage 218, amplifier stage 314 is configured to generate an amplified residual voltage 316 at an output of amplifier stage 314.

Second ADC 304 is connected to the output of amplifier stage 314. Second ADC 304 is configured to convert amplified residual voltage 316 at the output of amplifier stage 314 to generate extra digital output bits 317. In some examples, amplified residual voltage 316 may be less than a full resolution of second ADC 304. In some such examples, one or more higher resolution bits of second ADC 304 can be pre-loaded with logical zeros. The higher resolution bits correspond to voltage resolutions of second ADC 304 greater than amplified residual voltage 316. Such a configuration helps to enable using a same circuit template to implement first ADC 302 and second ADC 304. As shown, extra digital output bits 317 comprise a MSB of "N−1" to a LSB of "0." Second ADC 304 is configured to generate extra digital output bits 317 in parallel with first ADC 302 generating the second subset of digital output bits 308. Such a configuration can help to reduce a time to generate both the second subset of digital output bits 308 and extra digital output bits 317. As both first and second ADCs 302, 304 comprise the same circuit template, second ADC 304 has an extra residual output 318. Here, extra residual output 318 comprises a no-connection, and thus is not connected to other circuits. In other examples, extra residual output 318 may be connected to other circuits. The depicted example conversion circuit 300 is illustrative, and any other suitable circuit may be used as conversion circuit 300 in other examples.

Figure 4:
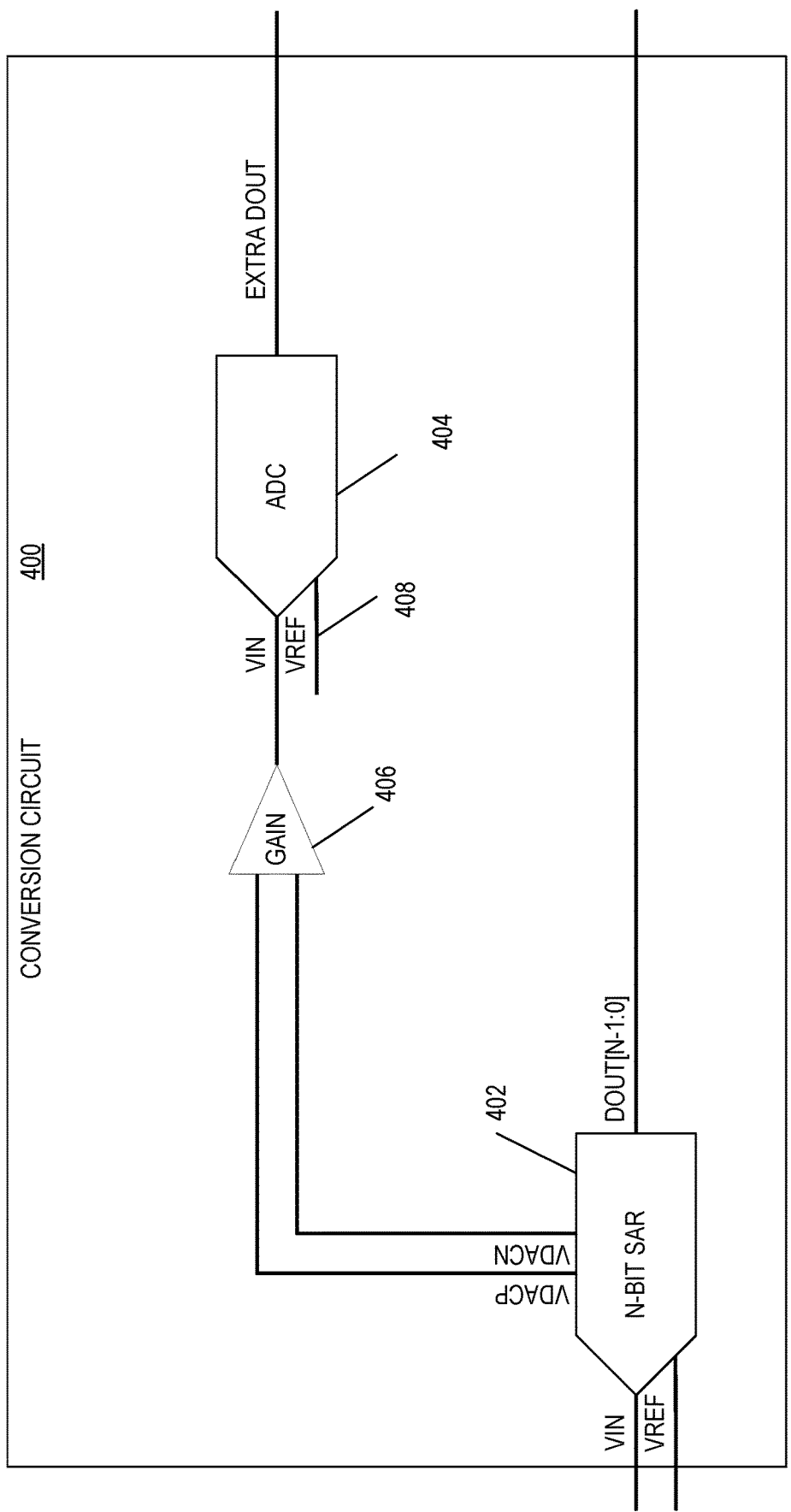
FIG. 4 schematically depicts an example conversion circuit using different circuit templates for a first ADC and a second ADC.

In the example of FIG. 3, a first ADC and a second ADC are implemented using a same circuit template. Alternatively, a first ADC and a second ADC can be implemented using different circuit templates. FIG. 4 schematically depicts an example conversion circuit 400 using different circuit templates to implement a first ADC 402 and a second ADC 404. Conversion circuit 400 is an example of conversion circuit 202. Similar to conversion circuit 300, conversion circuit 400 comprises first ADC 402 having a N-bit SAR ADC circuit template, and an amplifier stage 406. In contrast, second ADC 404 of conversion circuit 400 comprises a different ADC circuit template. In some examples, second ADC 404 uses a SAR ADC template having a bit resolution less than first ADC 402. In such examples, it will be appreciated that a reference voltage 408 of second ADC 404 is chosen to be compatible with a gain factor of amplifier stage 406. Such a configuration may help to reduce area and/or electrical power of conversion circuit 400. In other examples, second ADC 404 can comprise any other suitable ADCs, such as flash ADCs, integrating ADCs, sigma-delta ADCs, for example. The different ADC circuit template of second ADC 404 can be selected to help reduce area, electrical power, and/or developmental costs of conversion circuit 400. The depicted example conversion circuit 400 is illustrative, and any other suitable circuit may be used as conversion circuit 400 in other examples.

Figure 5:
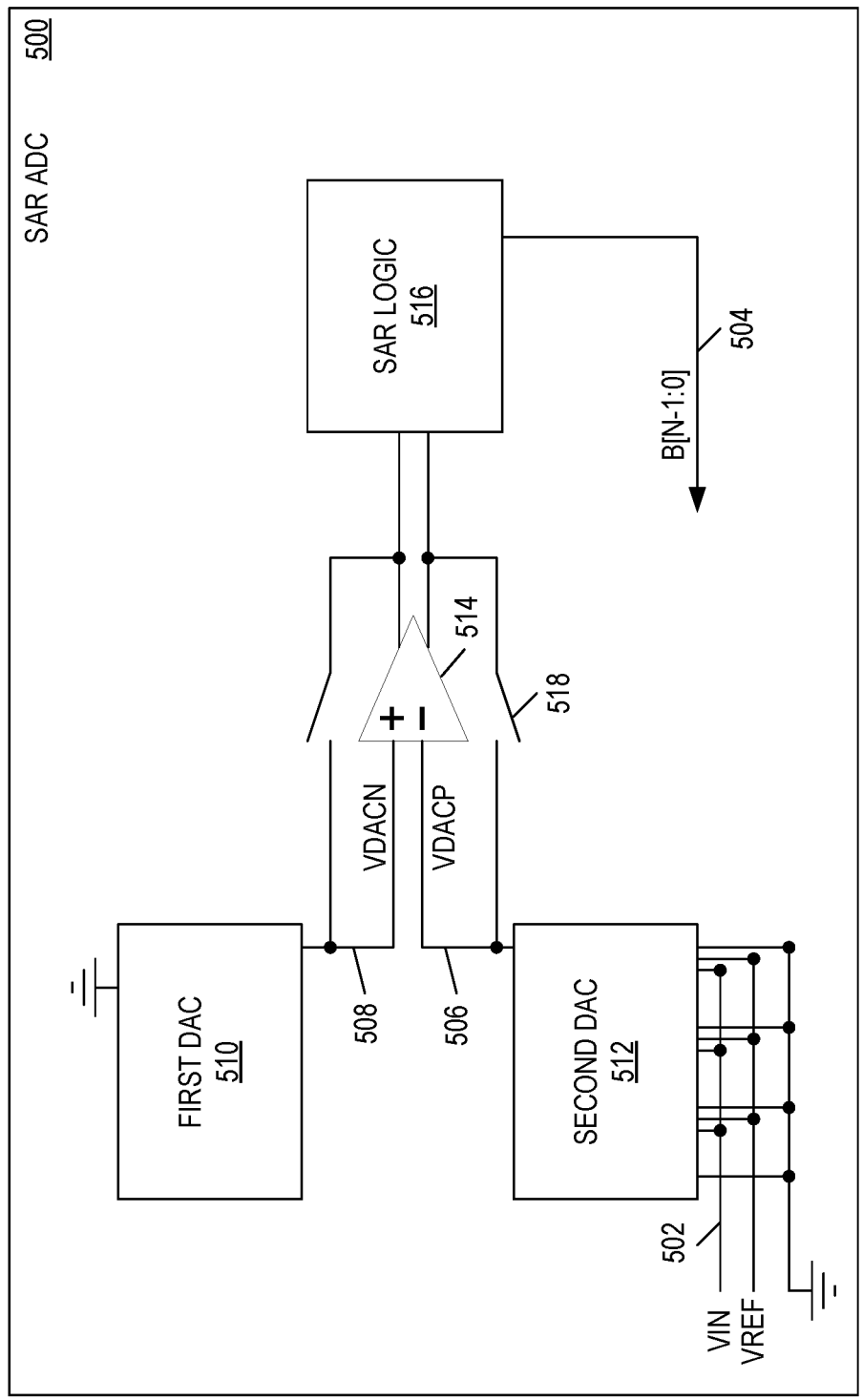
FIG. 5 schematically depicts an example successive approximation (SAR) ADC circuit template.

FIG. 5 schematically depicts an example SAR ADC 500. SAR ADC 500 can be used as first ADC 216, second ADC 222, first ADC 302, second ADC 304, and first ADC 402, for example. SAR ADC 500 is configured to convert an analog voltage 502 (shown here as "Vin") to generate digital bits 504 from a MSB to a bit k and from a bit k−1 to a LSB of SAR ADC 500. Here, the MSB is depicted as "N−1" and the LSB is depicted as "0." The bit k is between the MSB and the LSB of SAR ADC 500. SAR ADC 500 is further configured to output a residual voltage (shown here as Vdacp 506 and Vdacn 508) of analog voltage 502 after converting the bit k. More specifically, Vdacp 506 and Vdacn 508 are both used internally to SAR ADC 500 and connected to a residual output (not shown) of SAR ADC 500.

SAR ADC 500 comprises a first digital-to-analog converter (DAC) 510, a second DAC 512, a comparator 514, and SAR logic 516 to convert analog voltage 502. More specifically, first DAC 510 outputs Vdacn 508 and second DAC outputs Vdacp 506 based on analog voltage 502 and a reference voltage. First and second DACs 510, 512 can comprise any suitable DAC circuitry. Then comparator 514 compares Vdacn 508 and Vdacp 506. Comparator 514 is configured to output a logical one or zero based on the comparison. SAR logic 516 is configured to successively determine digital bits 504 from the MSB to the LSB based on the output of comparator 514. SAR ADC 500 can be reset using switches 518 between converting different analog voltages. In other examples, SAR ADC 500 can be reset in another suitable manner. The depicted example SAR ADC 500 is illustrative, and any other suitable circuit may be used as SAR ADC 500 in other examples.

Figure 6:
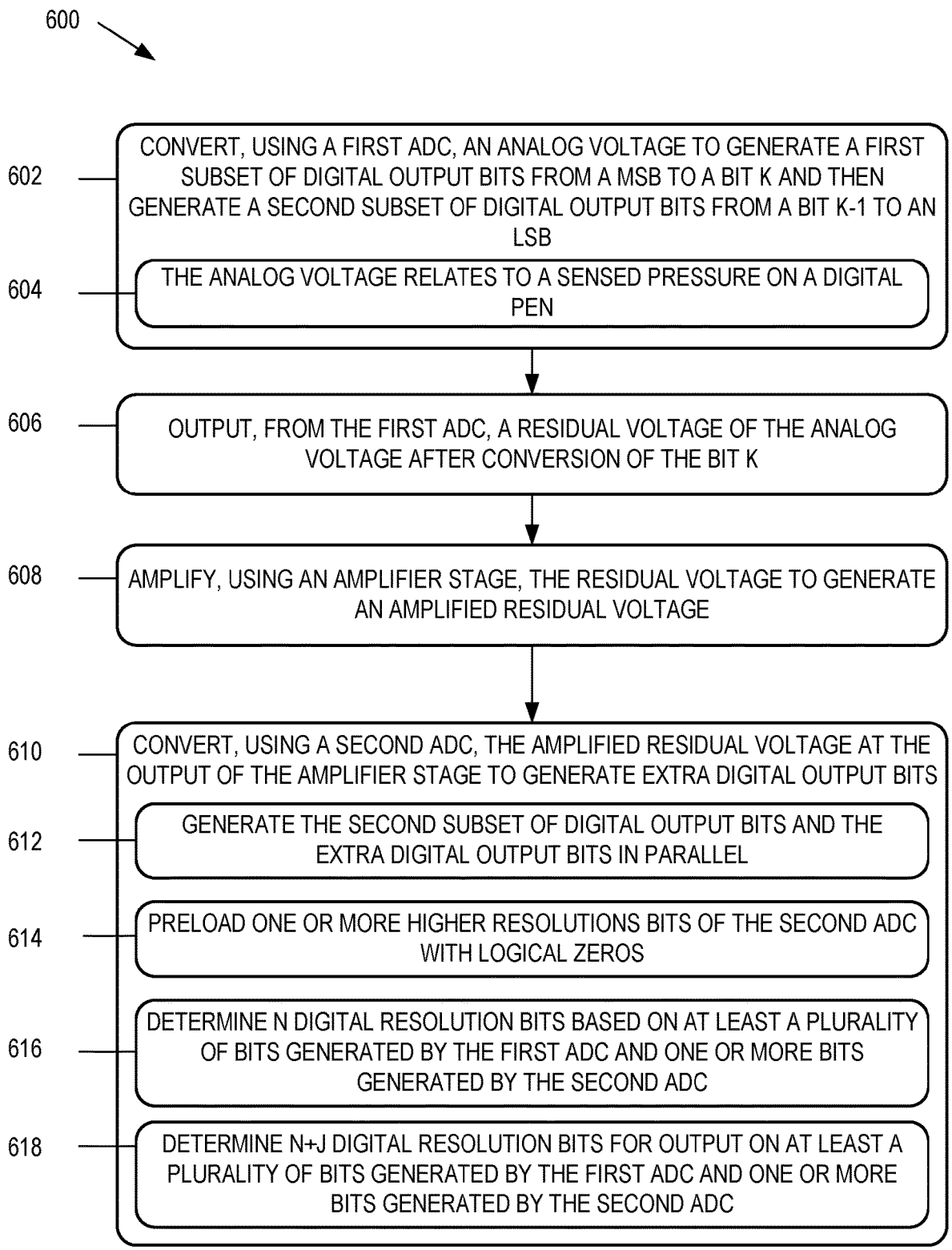
FIG. 6 illustrates a flow diagram illustrating an example method for using a conversion circuit.

FIG. 6 illustrates a flow diagram of an example method 600 for using a conversion circuit, such as conversion circuit 102, conversion circuit 202, conversion circuit 300, or conversion circuit 400, for example. The conversion circuit comprises a first ADC, an amplifier stage connected to a residual output of the first ADC, and a second ADC connected to an output of the amplifier stage. Method 600 comprises, at 602, converting, using the first ADC, an analog voltage to generate a first subset of digital output bits from a MSB to a bit k and then generating a second subset of digital output bits from a bit k−1 to a LSB of the first ADC. The bit k is between the MSB and the LSB of the first ADC. In some examples, the analog voltage relates to a sensed pressure on a digital pen, as indicated at 604. In other examples, the analog voltage may relate to another sensed quantity or another suitable analog voltage.

Method 600 further comprises, at 606, outputting, from the first ADC, a residual voltage of the analog voltage after conversion of the bit k. Next, method 600 comprises amplifying, using the amplifier stage, the residual voltage to generate an amplified residual voltage at the output of the amplifier stage, at 608. Then, method 600 comprises converting, using the second ADC, the amplified residual voltage at the output of the amplifier stage to generate extra digital output bits, at 610. Further, generating the second subset of digital output bits and generating the extra digital output bits are performed in parallel, as indicated at 612. In examples where the first ADC and the second ADC are implemented using a same circuit template, method 600 can comprise, at 614, preloading one or more higher resolution bits of the second ADC with logical zeros. Such a configuration can help to enable reuse of the same circuit template between the first ADC and the second ADC. Optionally, method 600 further comprises determining N digital resolution bits for output based on at least a plurality of bits generated by the first ADC and one or more bits generated by the second ADC, at 616. As a specific example, at least some bit values of the digital resolution bits are determined using digital signal processing. In some examples, the N digital resolution bits can be used for later processing. Alternatively, method 600 comprises determining N+j digital resolution bits for output based on at least a plurality of bits generated by the first ADC and one or more bits generated by the second ADC, at 618. Such a configuration extends a bit resolution of the conversion circuit.

A conversion circuit comprising a first ADC, an amplifier stage, and a second ADC as disclosed herein can help to extend a bit resolution over using just the first ADC, while also helping to reduce area, electrical power, and/or developmental costs of the conversion circuit. Alternatively, the conversion circuit comprising the first and second ADCs can help to increase an accuracy of the conversion circuit over using just the first ADC.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
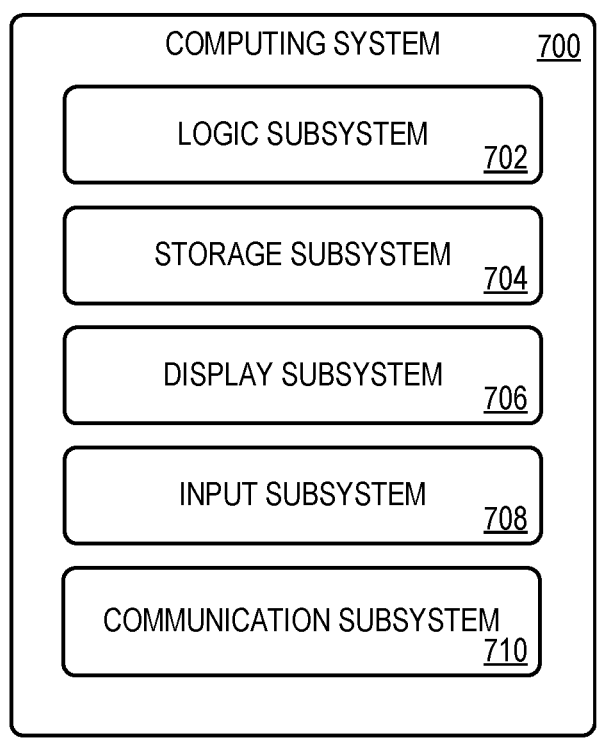
FIG. 7 depicts a block diagram of an example computing system.

FIG. 7 schematically shows a non-limiting embodiment of a computing system 700 that can enact one or more of the methods and processes described above. Computing system 700 is shown in simplified form. Computing system 700 may take the form of one or more personal computers, server computers, tablet computers, home-entertainment computers, network computing devices, gaming devices, mobile computing devices, mobile communication devices (e.g., smart phone), and/or other computing devices. Tablet 104 and device 200 are examples of computing system 700.

Computing system 700 includes a logic subsystem 702 and a storage subsystem 704. Computing system 700 may optionally include a display subsystem 706, input subsystem 708, communication subsystem 710, and/or other components not shown in FIG. 7.

Logic subsystem 702 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 704 includes one or more physical devices configured to hold instructions executable by the logic machine to implement the methods and processes described herein. When such methods and processes are implemented, the state of storage subsystem 704 may be transformed—e.g., to hold different data.

Storage subsystem 704 may include removable and/or built-in devices. Storage subsystem 704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 704 may include volatile, nonvolatile, dynamic, static, read/write, read-only, random-access, sequential-access, location-addressable, file-addressable, and/or content-addressable devices.

It will be appreciated that storage subsystem 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 702 and storage subsystem 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 706 may be used to present a visual representation of data held by storage subsystem 704. This visual representation may take the form of a graphical user interface (GUI). As the herein described methods and processes change the data held by the storage machine, and thus transform the state of the storage machine, the state of display subsystem 706 may likewise be transformed to visually represent changes in the underlying data. Display subsystem 706 may include one or more display devices utilizing virtually any type of technology. Such display devices may be combined with logic subsystem 702 and/or storage subsystem 704 in a shared enclosure, or such display devices may be peripheral display devices.

When included, input subsystem 708 may comprise or interface with one or more user-input devices such as a keyboard, mouse, touch screen, or game controller. In some examples, device 100 in the form of a digital pen can be configured as a user-input device. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 700 to send and/or receive messages to and/or from other devices via a network such as the Internet.

Another example provides a conversion circuit comprising a first analog-to-digital converter (ADC) configured to convert an analog voltage to generate a first subset of digital output bits from a most significant bit (MSB) to a bit k and generate a second subset of digital output bits from a bit k−1 to a least significant bit (LSB) of the first ADC, the bit k being between the MSB and the LSB of the first ADC, the first ADC comprising a residual output configured to output a residual voltage of the analog voltage after converting the bit k, an amplifier stage connected to the residual output of the first ADC and configured to generate an amplified residual voltage at an output of the amplifier stage, and a second ADC connected to the output of the amplifier stage; the second ADC configured to convert the amplified residual voltage at the output of the amplifier stage to generate extra digital output bits. In some such examples, the second ADC is alternatively or additionally configured to generate the extra digital output bits in parallel with the first ADC generating the second subset of digital output bits. In some such examples, the first ADC is alternatively or additionally a successive-approximation ADC. In some such examples, the first ADC and the second ADC are alternatively or additionally implemented using a same circuit template. In some such examples, the first ADC and the second ADC are alternatively or additionally implemented using different circuit templates. In some such examples, the amplifier stage alternatively or additionally comprises a linear amplifier.

Another example provides a method comprising converting, using a first analog-to-digital converter (ADC), an analog voltage to generate a first subset of digital output bits from a most significant bit (MSB) to a bit k and generating a second subset of digital output bits from a bit k−1 to a least significant bit (LSB) of the first ADC, the bit k being between the MSB and the LSB of the first ADC, outputting, from the first ADC, a residual voltage of the analog voltage after conversion of the bit k, amplifying, using an amplifier stage, the residual voltage to generate an amplified residual voltage at an output of the amplifier stage, and converting, using a second ADC, the amplified residual voltage at the output of the amplifier stage to generate extra digital output bits. In some such examples generating the second subset of digital output bits and generating the extra digital output bits are alternatively or additionally performed in parallel. In some such examples, the method alternatively or additionally comprises determining N digital resolution bits for output based on at least a plurality of bits generated by the first ADC and one or more bits generated by the second ADC. In some such examples the method alternatively or additionally comprises determining N+j digital resolution bits for output based on at least a plurality of bits generated by the first ADC and one or more bits generated by the second ADC. In some such examples, the first ADC and the second ADC are alternatively or additionally implemented using a same circuit template, and the method alternatively or additionally comprises preloading one or more higher resolution bits of the second ADC with logical zeros. In some such examples, the analog voltage alternatively or additionally relates to a sensed pressure on a digital pen.

Another example provides a device comprising a conversion circuit, the conversion circuit comprising a first analog-to-digital converter (ADC) configured to convert an analog voltage to generate a first subset of digital output bits from a most significant bit (MSB) to a bit k and generate a second subset of digital output bits from a bit k−1 to a least significant bit (LSB) of the first ADC, the bit k being between the MSB and the LSB of the first ADC, the first ADC comprising a residual output configured to output a residual voltage of the analog voltage after converting the bit k, an amplifier stage connected to the residual output of the first ADC and configured to generate an amplified residual voltage at an output of the amplifier stage, and a second ADC connected to the output of the amplifier stage, the second ADC configured to convert the amplified residual voltage at the output of the amplifier stage to generate extra digital output bits. In some such examples, the second ADC is alternatively or additionally configured to generate the extra digital output bits in parallel with the first ADC generating the second subset of digital output bits. In some such examples, the device alternatively or additionally comprises a digital signal processing module configured to determine N digital resolution bits for output based at least on a plurality of bits generated by the first ADC and one or more bits generated by the second ADC. In some such examples, The device alternatively or additionally comprises a digital signal processing module configured to determine N+j digital resolution bits for output based on at least a plurality of bits generated by the first ADC and one or more bits generated by the second ADC. In some such examples, the first ADC alternatively or additionally is a successive-approximation ADC. In some such examples, the first ADC and the second ADC alternatively or additionally are implemented using a same circuit template. In some such examples, the first ADC and the second ADC alternatively or additionally are implemented using different circuit templates. In some such examples, the amplifier stage alternatively or additionally comprises a linear amplifier.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A conversion circuit, comprising:
 a first analog-to-digital converter (ADC) comprising a first digital-to-analog converter (DAC) that outputs Vdacn, a second DAC that outputs Vdacp based at least upon an analog voltage, a comparator connected to the first DAC and the second DAC, and a residual output, the first ADC configured to determine, from an output of the comparator, a first subset of digital output bits from a most significant bit (MSB) to a bit k and then a second subset of digital output bits from a bit k−1 to a least significant bit (LSB) of the first ADC, the bit k being between the MSB and the LSB of the first ADC, the residual output being configured to output a residual voltage comprising Vdacn and Vdacp after converting the bit k;
 an amplifier stage connected to the residual output of the first ADC and configured to generate an amplified residual voltage at an output of the amplifier stage; and
 a second ADC connected to the output of the amplifier stage, the second ADC configured to convert the amplified residual voltage at the output of the amplifier stage to generate extra digital output bits, wherein the extra digital output bits and the second subset of digital output bits comprise overlapping information relating to the residual voltage.

2. The circuit of claim 1, wherein the second ADC is configured to generate the extra digital output bits in parallel with the first ADC generating the second subset of digital output bits.

3. The circuit of claim 1, wherein the first ADC is a successive-approximation ADC.

4. The circuit of claim 1, wherein the first ADC and the second ADC are implemented using a same circuit design.

5. The circuit of claim 1, wherein the first ADC and the second ADC are implemented using different circuit designs.

6. The circuit of claim 1, wherein the amplifier stage comprises a linear amplifier.

7. A method, comprising:
converting, using a first analog-to-digital converter (ADC), an analog voltage to generate a first subset of digital output bits from a most significant bit (MSB) to a bit k and then generating a second subset of digital output bits from a bit k−1 to a least significant bit (LSB) of the first ADC, the bit k being between the MSB and the LSB of the first ADC;
outputting, from the first ADC, a residual voltage of the analog voltage after conversion of the bit k;
amplifying, using an amplifier stage, the residual voltage to generate an amplified residual voltage at an output of the amplifier stage;
preloading one or more higher resolution bits of a second ADC with logical zeros, the second ADC being implemented using a same circuit design as the first ADC; and
converting, using the second ADC, the amplified residual voltage at the output of the amplifier stage to generate extra digital output bits, wherein the extra digital output bits and the second subset of digital output bits comprise overlapping information relating to the residual voltage.

8. The method of claim 7, wherein generating the second subset of digital output bits and generating the extra digital output bits are performed in parallel.

9. The method of claim 7, further comprising determining N digital resolution bits for output based on at least a plurality of bits generated by the first ADC and one or more bits generated by the second ADC, wherein the N digital resolution bits comprise a same number of bits as the number of bits from the MSB to the LSB of the first ADC.

10. The method of claim 7, further comprising determining N+j digital resolution bits for output based on at least a plurality of bits generated by the first ADC and one or more bits generated by the second ADC, wherein the N+j digital resolution bits comprise a number of bits that is greater than the number of bits from the MSB to the LSB of the first ADC.

11. The method of claim 7, wherein the analog voltage relates to a sensed pressure on a digital pen.

12. A device, comprising:
a conversion circuit, comprising:
a first analog-to-digital converter (ADC) comprising a first digital-to-analog converter (DAC) that outputs Vdacn, a second DAC that outputs Vdacp based at least upon an analog voltage, a comparator connected to the first DAC and the second DAC, and a residual output, the first ADC configured to determine, from an output of the comparator, a first subset of digital output bits from a most significant bit (MSB) to a bit k and then a second subset of digital output bits from a bit k−1 to a least significant bit (LSB) of the first ADC, the bit k being between the MSB and the LSB of the first ADC, the residual output being configured to output a residual voltage comprising Vdacn and Vdacp after converting the bit k;
an amplifier stage connected to the residual output of the first ADC and configured to generate an amplified residual voltage at an output of the amplifier stage; and
a second ADC connected to the output of the amplifier stage, the second ADC configured to convert the amplified residual voltage at the output of the amplifier stage to generate extra digital output bits, wherein the extra digital output bits and the second subset of digital output bits comprise overlapping information relating to the residual voltage.

13. The device of claim 12, wherein the second ADC is configured to generate the extra digital output bits in parallel with the first ADC generating the second subset of digital output bits.

14. The device of claim 12, further comprising a digital signal processing module configured to determine N digital resolution bits for output based at least on a plurality of bits generated by the first ADC and one or more bits generated by the second ADC, wherein the N digital resolution bits comprise a same number of bits as the number of bits from the MSB to the LSB of the first ADC.

15. The device of claim 12, further comprising a digital signal processing module configured to determine N+j digital resolution bits for output based on at least a plurality of bits generated by the first ADC and one or more bits generated by the second ADC, wherein the N+j digital resolution bits comprise a number of bits that is greater than the number of bits from the MSB to the LSB of the first ADC.

16. The device of claim 12, wherein the first ADC is a successive-approximation ADC.

17. The device of claim 12, wherein the first ADC and the second ADC are implemented using a same circuit design.

18. The circuit of claim 12, wherein the first ADC and the second ADC are implemented using different circuit designs.

19. The circuit of claim 12, wherein the amplifier stage comprises a linear amplifier.

* * * * *